United States Patent [19]

Zierhut

[11] 3,898,581

[45] Aug. 5, 1975

[54] ELECTRONIC SWITCH

[75] Inventor: Hermann Karl Zierhut, Rietheim, Germany

[73] Assignee: J. & J. Marquardt, Germany

[22] Filed: May 14, 1974

[21] Appl. No.: 469,756

[30] Foreign Application Priority Data

Sept. 8, 1969 Germany .......................... 1945357

[52] U.S. Cl. ................ 331/65; 331/117; 340/258 C

[51] Int. Cl. ........................................ G08b 23/00

[58] Field of Search ... 331/117, 65; 317/146, 148.5; 324/3, 41; 340/258 C

[56] References Cited

UNITED STATES PATENTS

| | | | |
|---|---|---|---|
| 3,098,202 | 7/1963 | Newell et al. | 331/117 |
| 3,147,408 | 9/1964 | Yamamoto et al. | 317/146 |
| 3,391,352 | 7/1968 | Fischman | 331/117 |
| 3,467,855 | 9/1969 | Rance | 324/3 |
| 3,469,204 | 9/1969 | Magyar et al. | 324/41 |
| 3,471,773 | 10/1969 | Penland | 324/3 |
| 3,492,541 | 1/1970 | Grebe et al. | 317/146 |
| 3,503,007 | 3/1970 | Kutschbach | 331/65 |
| 3,521,184 | 7/1970 | Bowker | 331/65 |
| 3,553,488 | 1/1971 | Darrow | 331/65 |

FOREIGN PATENTS OR APPLICATIONS

| | | | |
|---|---|---|---|
| 1,187,377 | 4/1967 | France | 331/65 |

*Primary Examiner*—John Kominski
*Attorney, Agent, or Firm*—McGlew and Tuttle

[57] ABSTRACT

A contactless electronic switch for providing signalling pulses utilizes a transistor oscillator as the main or primary component. The transistor oscillator includes a coil which may be damped by a tool steel core which is adjustable from outside the switch. Movement of the core switches the oscillator from a limiting state, with positive base current, to a limiting state with negative base current. A switching transistor is connected to the output of the transistor oscillator and, responsive to such switching of the transistor oscillator, has its base voltage abruptly switched from a value above the threshold value to a value below the threshold value so that the collector-emitter voltage is reduced to zero. In one embodiment, a coil, acting as a high frequency choke, is connected between the emitter of the transistor oscillator and the base of the switching transistor in association with a voltage divider. In the second embodiment, the base of the transistor oscillator, grounded for high frequency voltage, is connected through the voltage divider to the base of the switching transistor and a capacitor is connected across the voltage divider.

11 Claims, 2 Drawing Figures

PATENTED AUG 5 1975 3,898,581

ELECTRONIC SWITCH

CROSS-REFERENCE TO PRIOR APPLICATIONS

This application is a continuation-in-part of application Ser. No. 333,364, filed Feb. 16, 1973, for ELECTRONIC SWITCH and which is, in turn, a streamlined continuation application based on application Ser. No. 70,062, filed Sept. 8, 1970, for ELECTRONIC SWITCH, and now abandoned.

FIELD AND BACKGROUND OF THE INVENTION

In many industrial applications, electric switches must meet extremely high requirements as far as safety and reliability are concerned. In addition, the switches should have a long life up to 100 million switchings, and be dustproof. These requirements can be met only with electronic or contactless switches.

There are known switching arrangements in which a field plate is arranged inside a magnetic field and can be actuated from the exterior, such actuation in turn controlling a following transistor. In another arrangement, a Huth-Kuehn oscillator, known to those skilled in the art as a tuned-plate, tuned-grid (TPTG) oscillator, is used, and its input circuit is detuned sufficiently far that the oscillation stops. This interruption of an oscillation is also used in an oscillator which is in Meissner connection. The dipping of a metal vane between the collector circuit and the base coupling coil assures the interruption. Finally, there are known switching systems wherein a balanced high-frequency bridge is detuned and the switching operation is initiated, by the resulting voltage change, over an adjusting path switch. These known arrangements are very time consuming, require considerable balancing operations, and are quite expensive.

A Huth-Kuehn oscillator incorporates, as an active element, a transistor, and its frequency-determining elements include an external coil, an external capacitor, and the inner capacitance represented by the so-called collector-base capacitance. The feedback occurs over the external capacitor which interconnects the collector and the emitter, and this feedback results in the correct phase energy supply for maintenance of an undamped oscillation.

SUMMARY OF THE INVENTION

This invention relates to an electronic switch and, more particularly, to an improved arrangement for contactless signalling pulses utilzing a transistor oscillator as the priming component.

An objective of the invention is to provide an electronic switch which has no joints and force transmitting members for mechanical operations, and one which is absolutely safe and does not fail, even if dust should get in, as well as being insensitive to fluctuations in the mains voltages. Furthermore, an objective of the invention is to provide such an electronic switch which requires little space and which can be realized, at least in part, as an integrated circuit or I-C element, while permitting large manufacturing tolerances, making balancing operations unnecessary, and being inexpensive.

The electronic switch embodying the invention, which meets all these requirements, and which consists of an arrangement for contactless signalling with an oscillator as a primer component, with the working of the oscillatory circuit being able to be damped by a device, is characterized in that a limiting state of the oscillator transistor, with positive base current, can be changed abruptly, by damping the working oscillator circuit, into a limiting state of the oscillator transistor, with negative base current. The ensuing abrupt voltage change, for example across a resistor, is used as a switching criterion.

There can be advantageously used, as a damping device, a plunger of oscillation damping material, for example tool steel, whose position relative to the working coil of the oscillator can be changed. Changing of the state of the oscillator from positive base current to negative base current also can be effected over a suitable transducer, for example a capacitatively influenced transducer.

In an expedient form for such a switch, the control electrode of a transistor of a switching stage is connected to the base or to the emitter of the transistor of the oscillator, the oscillator serving as a triggering or priming component. The overall circuit is so dimensioned that the transistor of the switching stage is either triggered conductive or blocked, depending on the state of oscillation of the oscillator, so that the load resistance of the switching transistor stage has applied thereacross either the voltage $U_B - U_{CEsat}$, or the voltage 0.

The invention utilizes an oscillator whose working oscillatory circuit can be damped by means of a selectively operable device, and the oscillation state of which oscillatory circuit is then changed from a limiting state, with positive base current, to another limiting state, with negative base current. Due to the abrupt change from one state of oscillation to the other, a DC voltage change or pulse with an extremely high switching flank is obtained both on a suitably dimensioned base voltage divider and on an ohmic emitter resistance. This voltage change can then be transmitted to a series-connected transistor, using the threshold voltage, for example, of 0.7 volt in silicon transistors, as a defined switching threshold for the two switching states OFF and ON. By suitable dimensioning of the oscillator coil or winding, it is also possible to attain the desired switching function with a suitable hysteresis.

An object of the invention is to provide an improved electronic switch.

Another object of the invention is to provide such an electronic switch in the form of an arrangement for contactless signalling pulses utilizing a transistor oscillator as the priming or triggering component.

A further object of the invention is to provide such an electronic switch including externally accessible operating means operatively associated with the oscillator and operable, when actuated, to change the oscillation state of the oscillator from a limiting state, with positive base current, to a limiting state, with negative base current.

Another object of the invention is to provide such an electronic switch utilizing the resulting abrupt change in the oscillator output voltage as a switching criterion.

For an understanding of the principles of the invention, reference is made to the following description of typical embodiments thereof as illustrated in the accompanying drawing.

DESCRIPTION OF THE PREFERRED EMBODIMENTS

Figure 1:
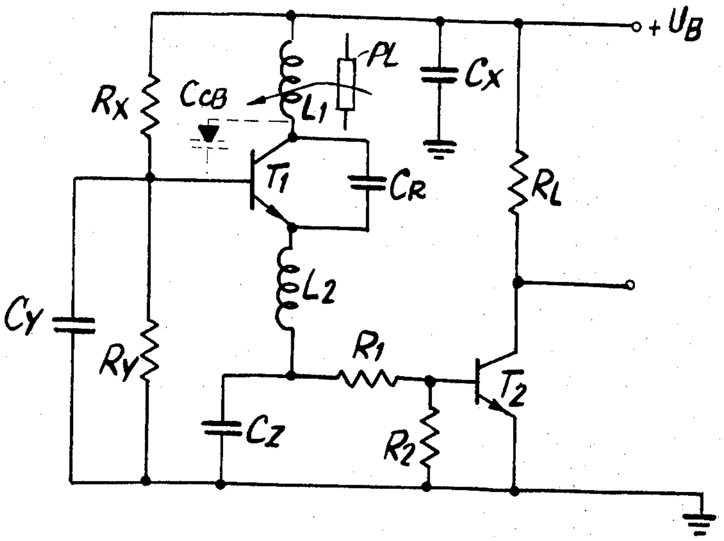
FIG. 1 is a schematic wiring diagram of one form of electronic switch embodying the invention.

FIG. 1 schematically illustrates one of the possible variations of the electronic switch in accordance with the principles of the invention. An oscillator transistor $T_1$ is in base connection. Coil or winding $L_1$ represents, with the help of switching capacities and the collector-base capacity of the transistor and of the feedback capacity $C_r$ between the collector and emitter, the working oscillatory circuit. This working oscillatory circuit can be selectively damped to an adjustable extent by means of a tool steel core PL, for example, which is inserted through the coil or winding $L_1$.

Capacitor $C_r$ forms the feedback capacity of the oscillator, and coil or winding $L_2$ is connected to the emitter of transistor $T_1$ and has a high inductance for offering a high resistance for the high frequency voltage but only a small resistance for the DC voltage. The oscillator frequency is determined by inductance $L_1$ and the total of the capacitances, namely the circuit capacitance, the collector-base capacitance $C_{CB}$ of transistor $T_1$, and feedback capacitance $C_r$.

When inductance $L_1$ is undamped by plunger or core PL, the magnitude of the oscillation amplitude represents a positive base current of oscillator transistor $T_1$, while the gradual or rapid damping of inductance $L_1$ by plunger or core PL reduces the amplitude of the oscillator frequency. A point thus is reached where the current of the base of oscillator transistor $T_1$ changes from a positive polarity to the negative polarity, so that the voltage of the base of a switching transistor $T_2$ changes suddenly, through voltage divider $R_1$, $R_2$, from 0.8 v to 0.5 v.

In effect, the current at the base of oscillator transistor $T_1$ is positive in accordance with the high magnitude, high frequency voltage when the oscillator is undamped. With the oscillator damped, there is a smaller magnitude high frequency voltage and the current at the base of transistor $T_1$ is negative. This is a decisive criterion, of which full use is made for the subsequent switching operation. Thus, the change in the voltage at the base of switching transistor $T_2$ results in the change of the voltage drop across load resistor $R_L$ from $U_B$–$U_{CEsat}$ to Ov, where $U_B$ is the voltage at the terminals of the supply potential and $U_{CEsat}$ is the voltage between the collector and emitter of transistor $T_2$ at their connection points. In order to emphasize the desired effect, which is the abrupt reversal of the polarity of the base current of transistor $T_1$ from positive to negative, a suitable capacity diode can be arranged between the collector and base of transistor $T_1$ as shown in broken lines at $C_{CB}$.

In principle, the oscillator shown in FIG. 1 is a Colpitts oscillator in which the resistors $R_X$ and $R_Y$ whose junction point is connected to the base of transistor oscillator $T_1$ are the base voltage-divider resistors of transistor $T_1$. Capacitor $C_Y$ is a by-pass capacitor, and inductance $L_1$ is the signal current coil for transistor oscillator $T_1$. Capacitor $C_r$ is a feedback capacitor and inductance $L_2$ is a high frequency choke constituting a high resistance for high frequency. Resistors $R_1$ and $R_2$ are the base voltage-divider resistors for switching transistor $T_2$, and capacitor $C_Z$, connected in parallel with these resistors in series with inductance $L_2$, is a capacitor connecting the high frequency choke $L_2$ to ground for the high frequency voltage. Grounded capacitor $C_X$ connected to the junction between input terminal $U_B$ and inductance $L_1$ is a partial capacitance of the oscillating circuit capacitance of the known Colpitts oscillator.

Figure 2:
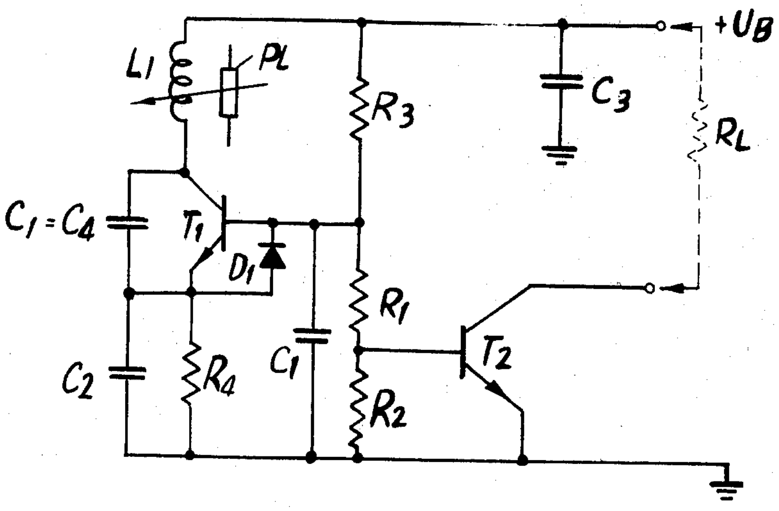
FIG. 2 is a schematic wiring diagram of another form of electronic switch embodying the invention.

FIG. 2 illustrates another embodiment of the invention in which, in contrast to the circuit shown in FIG. 1, emitter inductance coil $L_2$ is omitted. In order to accelerate the mentioned change from positive base current to negative base current of oscillator transistor $T_1$, an additional diode $D_1$ is connected, with the indicated polarity, between the emitter and the base of transistor $T_1$, if the base-emitter Zener voltage of oscillator transistor $T_1$ is not sufficiently low, and this reduces the Zener voltage to the desired value. As known to those skilled in the art, the Zener voltage of the emitter junction of oscillator transistor $T_1$ controls the point of oscillation and, in the present invention, it is desired that this Zener voltage be reduced to the lowest possible magnitude.

The coupling of switching transistor $T_2$ to the oscillator circuit is effected through voltage divider resistances $R_1$ and $R_2$ so that the control of the voltage on the base of switching transistor $T_2$ in contrast to the arrangement of FIG. 1, takes place on the base electrode of switching transistor $T_2$, which is grounded, in terms of high frequency.

Capacitor $C_2$, having a value of several picofarads, shifts the phase of the oscillator voltage, regenerated over capacitor $C_4$, into the optimum position. Capacitor $C_1$ acts as a short circuit for the high frequency, but must not be selected too large as, otherwise, the switching flanks of the reversing function would become too flat. In a practical test circuit, values of 200 to 500 picofarads were used for capacitance $C_1$. Capacitor $C_3$ serves merely to block the high frequency from the operating voltage.

Diode $D_1$ of FIG. 2 is a normal reverse-biased diode which, in the same manner as any other diode, has a certain barrier-layer capacitance. As known to those having ordinary skill in the art, there are also other diodes with variable capacitance, wherein the capacitance of the barrier-layer can be controlled by the amplitude or magnitude of the applied voltage. It is these types of diodes which are meant by the term "capacity diode" as used heretofore in the description. In addition, and as also known to those having ordinary skill in the art, the connection between the base emitter of a transistor constitutes a diode, and such a diode is subjected to the Zener effect, although it is not usual or customary, when graphically representing a transistor, to represent this base-emitter diode as a Zener diode.

Naturally, the entire circuit of either FIG. 1 or FIG. 2, or a part thereof, except for the inductors, can also take the form of an integrated circuit. As is well known to those having ordinary skill in the art, at least semiconductor elements, as well as resistors and capacitors, can be executed in an integrated circuit technique as long as these components do not exceed certain maximum values. On the other hand, coils or windings are generally provided as discrete components, which are connected externally to the integrated circuit board, such as a printed circuit board.

While specific embodiments of the invention have been shown and described in detail to illustrate the application of the principles of the invention, it will be understood that the invention may be embodied otherwise without departing from such principles.

What is claimed is:

1. Arrangement for contactless signalling pulses comprising, in combination, a transistor oscillator including a transistor having a base, an emitter and a collector, and including a resonance circuit with a non-linear oscillation characteristic; said resonance circuit connecting said collector to an external source of potential; a feedback capacitor connected directly between the emitter and collector of said transistor; high frequency by-pass means connected between one of said emitter and said base and the ground; externally acessible damping means operatively associated with said resonance circuit and operable, when actuated, to control said resonance circuit, utilizing its non-linear oscillation characteristic, between a state of undamped oscillation of said oscillator, wherein the base current of said transistor has a positive polarity, and a state of damped oscillation of said oscillator, wherein the base current of said transistor has a negative polarity to abruptly change the polarity of the base current of said transistor between positive polarity and negative polarity; and voltage amplitude responsive switching means connected to said one of said emitter and said base of said transistor and operable, responsive to the abrupt change in the transistor oscillator output voltage, resulting from such reversal of the polarity of the base current of said transistor, to effect a switching operation.

2. Arrangement for contactless signalling pulses, as claimed in claim 1, in which said resonance circuit includes an oscillator coil connected between said collector and said source; said damping means damping said coil.

3. Arrangement for contactless signalling pulses, as claimed in claim 2, in which said damping means comprises a plunger, of material damping the high frequency oscillations, which is insertable into said oscillator coil to change the amplitude of oscillation.

4. Arrangement for contactless signalling pulses, as claimed in claim 1, in which said switching means is connected to the emitter of said transistor.

5. Arrangement for contactless signalling pulses, as claimed in claim 1, in which said switching means is connected to the base of said transistor.

6. Arrangement for contactless signalling pulses, as claimed in claim 1, including a capacity diode connected between the collector and base of said transistor to increase the inner voltage-dependent capacity between said collector and said base.

7. Arrangement for contactless signalling pulses, as claimed in claim 1, in which the transistor of said transistor oscillator has the largest possible collector-base capacity.

8. Arrangement for contactless signalling pulses, as claimed in claim 1, in which the transistor of said transistor oscillator has the smallest possible Zener breakdown voltage of the base-emitter diode.

9. Arrangement for contactless signalling pulses, as claimed in claim 1, including a diode connected between the base and emitter of the transistor to vary the base bias voltage of the transistor by rectifying the peaks of the high oscillator voltage on the emitter.

10. Arrangement for contactless signalling pulses, as claimed in claim 1, in which said transistor oscillator includes an emitter resistance; said switching means comprising a switching transistor; and a network supplying, to said switching transistor, the abrupt voltage variation appearing across said emitter resistance upon actuation of said operating means.

11. Arrangement for contactless signalling pulses, as claimed in claim 1, including a switching transistor as said switching means; and a network connecting the base of said oscillator transistor to said switching transistor and supplying, to said switching transistor the abrupt voltage variation appearing on the base of said oscillator transistor upon actuation of said damping means.

* * * * *